United States Patent [19]

Tominaga et al.

[11] Patent Number: 5,627,012
[45] Date of Patent: May 6, 1997

[54] METHOD FOR PREPARING PHASE CHANGE OPTICAL RECORDING MEDIUM

[75] Inventors: Junji Tominaga; Ryo Inaba, both of Nagano; Susumu Haratani, Chiba, all of Japan

[73] Assignee: TDK Corporation, Tokyo, Japan

[21] Appl. No.: 598,913

[22] Filed: Feb. 9, 1996

[30] Foreign Application Priority Data

Feb. 13, 1995 [JP] Japan .................................. 7-047822

[51] Int. Cl.$^6$ .................................................. C23C 14/34
[52] U.S. Cl. .................. 430/270.13; 430/945; 430/346; 204/192.15; 204/192.26; 204/192.27
[58] Field of Search ........................... 204/192.1, 192.5, 204/192.26, 192.27, 192.28, 298.12, 298.13; 430/270.13, 495, 396, 321, 945

[56] References Cited

U.S. PATENT DOCUMENTS

| | | | |
|---|---|---|---|
| 5,011,723 | 4/1991 | Harigaya et al. | 430/270.13 |
| 5,095,479 | 3/1992 | Harigaya et al. | 430/270.13 |
| 5,298,305 | 3/1994 | Shinozuka et al. | 430/270.13 |
| 5,314,734 | 5/1994 | Nishida et al. | 430/270.13 |
| 5,395,735 | 3/1995 | Nagata et al. | 430/270.13 |
| 5,418,030 | 5/1995 | Tominaga et al. | 430/270.13 |
| 5,498,507 | 3/1996 | Handa et al. | 430/270.13 |
| 5,523,140 | 6/1996 | Tominaga et al. | 430/270.13 |

FOREIGN PATENT DOCUMENTS

| | | |
|---|---|---|
| 2-003131 | 1/1990 | Japan . |
| 2-005246 | 1/1990 | Japan . |
| 2-098847 | 4/1990 | Japan . |
| 3-076027 | 4/1991 | Japan . |
| 4-281219 | 10/1992 | Japan . |
| 4-366424 | 12/1992 | Japan . |

OTHER PUBLICATIONS

Atomic Scale Solid–Solid Reaction Mechanisms of Metal with Chalcogen Films Studied; Applied Physics; vol. 60; No. 12 (1991); Shiojiri; pp. 1239–1242.

"V and Ti doping . . . ", Jpn. J. Appl. Phys. vol. 32 pt 1 No. 5a (1993) pp. 1980–1982.

*Primary Examiner*—Martin Angebranndt
*Attorney, Agent, or Firm*—Watson Cole Stevens Davis, PLLC.

[57] ABSTRACT

An optical recording medium is prepared by forming on a substrate a phase change recording layer comprising elements A, B, C and optional D wherein A is silver and/or gold, B is antimony and/or bismuth, C is tellurium and/or selenium, D is indium or a mixture of indium and aluminum and/or phosphorus. Formation of the recording layer is carried out by the step of sputtering an A—C base metal and the step of sputtering a B base metal optionally containing D in this successive order or reverse order; or by the step of sputtering an A—C base metal, the step of sputtering a B base metal, and the step of sputtering a D base metal in this successive order or reverse order. Since the resulting recording layer is already crystallized, the method eliminates a need for extra initialization.

15 Claims, 1 Drawing Sheet

- 7 (PROTECTIVE LAYER)
- 6 (REFLECTIVE LAYER)
- 5 (UPPER DIELECTRIC LAYER)
- 4 (RECORDING LAYER)
- 3 (LOWER DIELECTRIC LAYER)
- 2 (SUBSTRATE)
- 1 (OPTICAL RECORDING MEDIUM)

- 7 (PROTECTIVE LAYER)
- 6 (REFLECTIVE LAYER)
- 5 (UPPER DIELECTRIC LAYER)
- 4 (RECORDING LAYER)
- 32 (LOW REFRACTIVE INDEX LAYER)
- 31 (HIGH REFRACTIVE INDEX LAYER)
- 2 (SUBSTRATE)
- 1 (OPTICAL RECORDING MEDIUM)

METHOD FOR PREPARING PHASE CHANGE OPTICAL RECORDING MEDIUM

BACKGROUND OF THE INVENTION

1. Field of the Invention

This invention relates to an optical recording medium adapted to record information in a recording layer by irradiating a light beam thereto to induce a crystallographic change. More particularly, it relates to a method for preparing the optical recording medium.

2. Prior Art

Highlight is recently focused on optical recording media capable of recording information at a high density and erasing the recorded information for overwriting. One typical rewritable optical recording medium is of the phase change type wherein laser light is directed to the recording layer to change its crystallographic state whereupon a change of reflectance by the crystallographic change is detected. Optical recording media of the phase change type are of great interest since they can be overwritten by a single light beam and operated by a drive unit with a relatively simple optical system as compared with magneto-optical recording media.

Most optical recording media of the phase change type used Ge—Te systems which provide a substantial difference in reflectance between crystalline and amorphous states and have a relatively stable amorphous state. It was recently proposed to use new compounds known as chalcopyrites. Chalcopyrite compounds were investigated as compound semiconductor materials and have been applied to solar batteries and the like. The chalcopyrite compounds are composed of Ib-IIIb-VIb$_2$ or IIb-IVb-Vb$_2$ as expressed in terms of the Groups of the Periodic Table and have two stacked diamond structures. The structure of chalcopyrite compounds can be readily determined by X-ray structural analysis and their basic characteristics are described, for example, in Physics, Vol. 8, No. 8 (1987), pp. 441 and Denki Kagaku (Electrochemistry), Vol. 56, No. 4 (1988), pp. 228.

Among the chalcopyrite compounds, AgInTe$_2$ is known to be applicable as a recording material by diluting it with Sb or Bi. The resulting optical recording media are generally operated at a linear velocity of about 7 m/s. See Japanese Patent Application Kokai (JP-A) No. 240590/1991, 99884/1991, 82593/1991, 73384/1991, and 151286/1992.

In addition to these phase change type optical recording media using chalcopyrite compounds, JP-A 267192/1992, 232779/1992, and 166268/1994 disclose phase change type optical recording media wherein a recording layer crystallizes to create an AgSbTe$_2$ phase.

For prior art phase change type optical recording media, recording layers are formed using vacuum deposition equipment and remain amorphous immediately after formation. The recording layers must be crystallized by an operation generally known as initialization before the recording media can be utilized as rewritable media.

Initialization is carried out in various ways, for example, after a recording layer is formed on a substrate, by heating the substrate to the crystallization temperature of the recording layer for crystallization as disclosed in JP-A 3131/1990; illuminating a laser beam to the recording layer for crystallization, which method is called solid phase initialization, as disclosed in JP-A 366424/1992, 201734/1990 and 76027/1991; illuminating flash light to the substrate to achieve pseudo-crystallization by so-called photo-darkening, which method takes advantage of the photo characteristics of calcogen compounds, as disclosed in JP-A 281219/1992; and high-frequency induction heating the medium. JP-A 98847/1990 proposes to heat a substrate during formation of a recording layer to thereby crystallize the recording layer. JP-A 5246/1990 discloses a method involving the steps of forming a first dielectric layer, forming a recording layer thereon, heating it for crystallization, and forming a second dielectric layer thereon.

However, the initialization step by laser beam illumination takes a long time and is makes the productivity lower. Heating of the overall medium rejects the use of inexpensive resin substrates. That is, resin substrates can be distorted upon heating for initialization, causing errors in tracking. The method of illuminating flash light is also low in productivity because several shots of illumination are necessary to achieve full crystallization.

Under the circumstances, the use of a so-called bulk erasing is the only technique which is regarded commercially acceptable and currently used. The bulk eraser illuminates a beam from a high power gas or semiconductor laser through a relatively large aperture stop for crystallizing a multiplicity of tracks altogether. Since the bulk eraser permits the recording layer to be locally heated, the substrate temperature is elevated to a little extent, enabling the use of less heat resistant resins as substrates.

The bulk eraser, however, requires a time of several minutes for initializing optical recording discs of 12 cm in diameter. Then the initializing step is a rate-determining step in the making of optical recording discs. While TeGeSb base materials are currently most widely used for phase change recording layers, it is believed that the initializing operation cannot be removed insofar as these materials are used.

SUMMARY OF THE INVENTION

Therefore, an object of the present invention is to provide a novel and improved phase change optical recording medium which eliminates initializing operation after formation of a recording layer.

In a first form, the present invention provides a method for preparing an optical recording medium comprising the step of forming a phase change recording layer on a substrate, said recording layer comprising a recording material containing elements A, B and C wherein A is at least one element of silver and gold, B is at least one element of antimony and bismuth, and C is at least one element of tellurium and selenium. The recording layer forming step includes in an adjacent manner the step of sputtering an A—C base metal composed mainly of elements A and C and the step of sputtering a B base metal composed mainly of element B. The method eliminates the step for crystallizing the recording layer for initialization.

The B base metal may contain element D wherein D is indium or a mixture of indium and at least one of aluminum and phosphorus. Alternatively, the recording layer forming step may include adjacent to the B base metal sputtering step, the step of sputtering a D base metal composed mainly of D.

Preferably, at least one of the A—C base metal, the B base metal, and the D base metal further contains M wherein M is at least one element selected from the group consisting of Ti, Zr, Hf, V, Nb, Ta, Mn, W, and Mo.

In a second form, the present invention provides a method for preparing an optical recording medium comprising the step of forming a phase change recording layer on a substrate, said recording layer comprising a recording material containing element B wherein B is at least one element of antimony and bismuth. The recording layer forming step includes in an adjacent manner the step of sputtering a B base metal composed mainly of element B and the step of sputtering a low Tx metal composed mainly of a metal element having a lower crystallization temperature than said B. The method eliminates the step for crystallizing the recording layer for initialization.

Preferably, the recording layer forming step further includes adjacent to the B base metal sputtering step the step of sputtering a high Tx metal composed mainly of a metal element having a higher crystallization temperature than said B.

In both the first and second forms, the recording layer preferably has a thickness of 100 to 500Å.

Preferably in the first and second forms, the recording material is of the formula: $A_aB_bC_cD_dM_e$ wherein A, B, C, D, and M are as defined above, letters a, b, c, d, and e represent atomic ratios and fall in the range: $3.0 \leq a \leq 13.0$, $45.0 \leq b \leq 87.0$, $8.0 \leq c \leq 34.0$, $2.0 \leq d \leq 8.0$, $0 \leq e \leq 5.0$, and $a+b+c+d+e=100$. The recording layer may contain an $ABC_2$ phase, a B phase, and a D—C phase.

Also contemplated herein is an optical recording medium prepared by the present method.

In the present disclosure, the adjacent relationship between two sputtering steps means that one step is distinct from and followed by the other step.

ADVANTAGES

In the prior art phase change optical recording media described in the preamble, a recording layer formed as by sputtering, which is amorphous, is typically initialized by heating and then slowly cooling for allowing a crystalline phase to precipitate. A recording light beam is irradiated to the initialized recording layer whereupon the irradiated spot is melted and then rapidly cooled as the light beam is moved away, thereby forming a recorded mark in amorphous or microcrystalline state. Japanese Patent Application Nos. 108996/1992, 179267/1992, 253832/1992, 17968/1993, 341818/1993, and 87854/1994 by the inventors disclose recording layers based on Ag, Sb, Te, and In (which correspond to A, B, C, and D in the present invention, respectively) to which V, Ti or the like (which corresponds to M in the present invention) is added for improving reliability and other properties. These recording layers essentially require initializing operation. These recording layers are formed by sputtering of a Sb target having chips of other metals attached to the surface thereof. JP-A 166268/1994 discloses an optical information recording medium having a recording layer which contains Ag, In, Sb and Te and has a crystalline $AgSbTe_2$ phase in unrecorded and erased states. After the recording layer is formed by sputtering, it undergoes initializing operation.

As opposed to these prior art methods, the present invention eliminates a need for initializing operation by separating the step of sputtering B base metal and the step of sputtering another metal, thereby making it possible to crystallize the recording layer during its formation.

In one preferred embodiment, the step of sputtering B base metal is preceded by the step of sputtering A—C base metal. The B base metal may contain D. Alternatively, the step of sputtering B base metal may be followed by the step of sputtering D base metal.

The crystallizing process is described below by referring to a typical embodiment wherein the B base metal is antimony (Sb), the A—C base metal is silver-tellurium (Ag—Te), the D base metal is indium (In), and the formation of a recording layer is carried out in the order of:

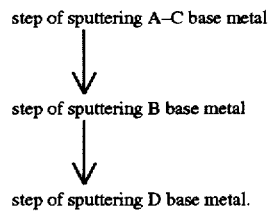

Silver and tellurium are known to interdiffuse at room temperature as reported, for example, in Shiojiri, Oyo Butsuri (Applied Physics), Vol. 60, 1991, pp. 1239–42, and their mixtures will crystallize even at room temperature. Since substrates of optical recording media are often formed of resins having a low heat transfer rate, the step of sputtering A—C base metal will elevate the substrate temperature to about 100° C. Since the sputtered film is thin, it completes crystallization during deposition without requiring a long crystallization time of 2 hours as described in Shiojiri's article. There is formed a crystalline Ag—Te phase. In the subsequent step of sputtering B base metal, there are formed an AgSb phase by diffusion of silver into antimony in the sputtered film and an $AgSbTe_2$ phase by interdiffusion. Although the crystallization temperature of $AgSbTe_2$, that is, the temperature necessary to convert an amorphous state into a crystalline state is above 200° C., a $AgSbTe_2$ phase can be formed as a consequence of the temperature elevation (typically, up to about 120° C.) during sputtering because the present method utilizes interdiffusion. Since antimony crystallizes at 90° C., the step of sputtering B base metal results in a film having $AgSbTe_2$, AgSb, and Sb phases. In the subsequent step of sputtering D base metal, indium diffuses into the sputtered film to form an In—Te phase.

Next, the crystallizing process is described by referring to another typical embodiment wherein the B base metal is antimony (Sb)+indium (In), the A—C base metal is silver-tellurium (Ag—Te), and the formation of a recording layer is carried out in the order of:

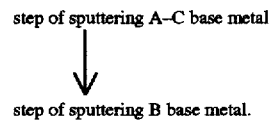

Also in this embodiment, the step of sputtering A—C base metal forms a crystalline Ag—Te phase. In the subsequent step of sputtering B base metal, there are formed an AgSb phase by diffusion of silver into antimony in the sputtered film and an $AgSbTe_2$ phase by interdiffusion. Indium contained in the B base metal diffuses into the sputtered film to form an In—Te phase.

It is noted that a dielectric layer and a reflective layer are usually formed on the recording layer, and heating associated with formation of these layers assists in precipitating requisite crystalline phases as mentioned above.

In this way, a crystallized film containing a plurality of mixed phases including a $AgSbTe_2$ phase is obtained without initializing operation according to the present method.

In other embodiments of the invention, a recording layer can be similarly crystallized during its formation. In embodiments where the order of steps is inverted, for example, an embodiment wherein the formation of a recording layer is carried out in the order of:

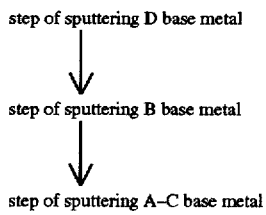

or in another embodiment wherein the formation of a recording layer is carried out in the order of:

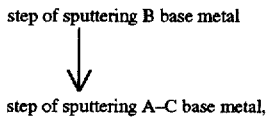

there is also formed a substantially crystallized recording layer. By avoiding simultaneous sputtering of A—C and B and/or D, the invention has succeeded in forming the above-mentioned crystalline phases at low temperature.

BRIEF DESCRIPTION OF THE DRAWINGS

These and further features of the present invention will be apparent with reference to the following description and drawings, wherein.

BEST MODE FOR CARRYING OUT THE INVENTION

Figure 1:
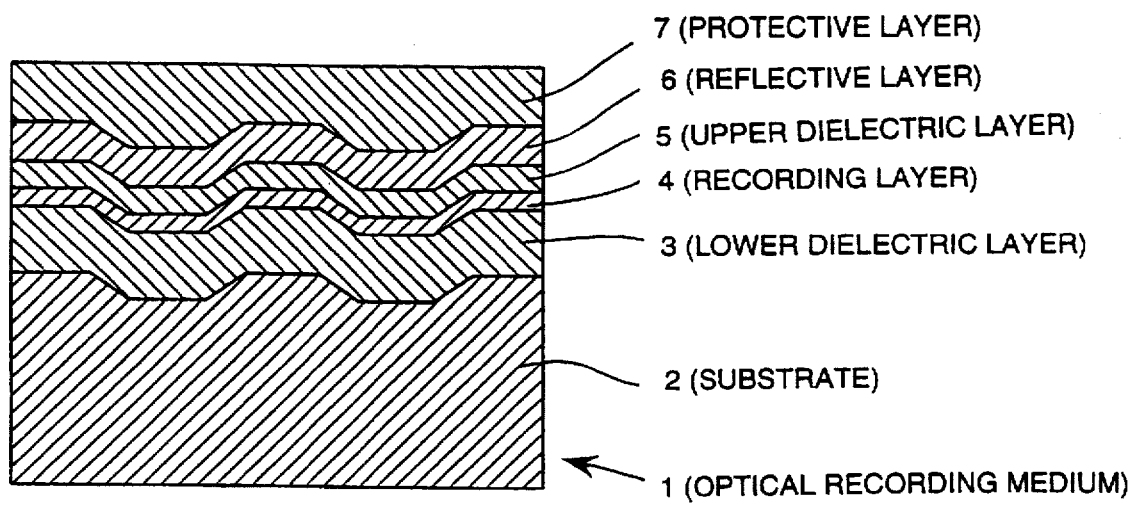
FIG. 1 is a schematic cross-sectional view of a portion of an optical recording medium which is prepared by the present method.

Briefly stated, the method for preparing an optical recording medium according to the present invention includes the step of forming a phase change recording layer on a substrate.

In a first form of the invention, a recording layer comprising A, B and C is formed wherein A is silver (Ag) and/or gold (Au), B is antimony (Sb) and/or bismuth (Bi), and C is tellurium (Te) and/or selenium (Se).

The recording layer forming step includes in an adjacent manner the step of sputtering an A—C base metal composed mainly of elements A and C and the step of sputtering a B base metal composed mainly of element B. The method does not involve any extra step for crystallizing the recording layer for initialization. Preferred embodiments of the first form of the invention are shown below as Embodiments 1-1 and 1-2.

FIRST FORM

Embodiment 1-1

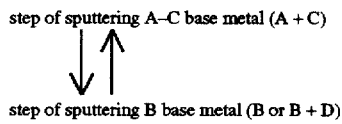

Embodiment 1-2

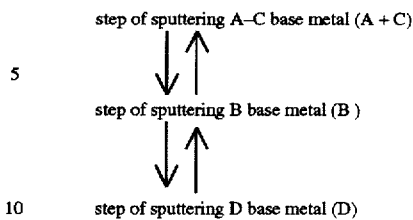

Embodiment 1-1 includes the step of sputtering an A—C base metal and the step of sputtering a B base metal. In this embodiment, it is preferred that the B base metal further contain D wherein D is indium (In) or a mixture of indium and aluminum (Al) and/or phosphorus (P). It is also preferred that either one or both of the A—C base metal and the B base metal further contain M wherein M is at least one element selected from the group consisting of Ti, Zr, Hf, V, Nb, Ta, Mn, W, and Mo.

Embodiment 1-2 further includes the step of sputtering a D base metal composed mainly of element D, adjacent to the step of sputtering a B base metal. It is preferred in this embodiment that at one of the A—C base metal, the B base metal, and the D base metal further contain M.

Preferably in both Embodiments 1-1 and 1-2, the step of sputtering A—C base metal is followed by the step of sputtering B base metal. This sequence of sputtering steps facilitates diffusion of A into the B base metal and hence, crystallization.

In the first form of the invention, Embodiment 1-2 is more preferred because of ease of preparation of a sputtering target, ease of control of a film composition, and film uniformity.

In a second form of the invention, the recording layer forming step includes in an adjacent manner the step of sputtering a B base metal composed mainly of B and the step of sputtering a low Tx metal composed mainly of a metal element having a lower crystallization temperature than said B. The method does not involve any extra step for crystallizing the recording layer for initialization. Preferred embodiments of the second form of the invention are shown below as Embodiments 2-1 and 2-2.

SECOND FORM

Embodiment 2-1

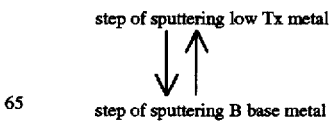

Embodiment 2-2

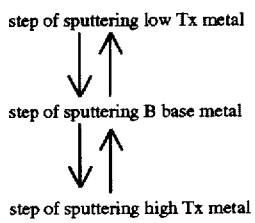

step of sputtering low Tx metal step of sputtering B base metal step of sputtering high Tx metal Embodiment 2-1 includes the step of sputtering a low Tx metal and the step of sputtering a B base metal.

Embodiment 2-2 further includes the step of sputtering a high Tx metal composed mainly of a metal element having a higher crystallization temperature than said B, adjacent to the step of sputtering a B base metal.

In both Embodiments 2-1 and 2-2, it is preferred that the step of sputtering low Tx metal is followed by the step of sputtering B base metal. This sequence of sputtering steps facilitates diffusion of low Tx metal into the B base metal and hence, crystallization.

The B base metal used in the second form is the same as in the first form.

The low Tx metal is composed mainly of a metal element having a lower crystallization temperature than said B base metal, which is preferably selected from the A—C base metal used in the first form. For example, Ag—Te usually has a lower crystallization temperature than Sb. The high Tx metal is composed of metal element having a higher crystallization temperature than said B base metal, which is preferably selected from the D-base metal.

In the preferred embodiments of the first and second forms of the present invention, there are formed recording layers which preferably contains elements A, B, and C, more preferably elements A, B, C, and D, most preferably elements A, B, C, D, and M. In these recording layers, unrecorded areas are crystalline and recorded marks are amorphous or microcrystalline.

In order that the recording layer crystallize through the above-mentioned mechanism as it is being formed, the respective metals should preferably meet the following conditions.

The A—C base metal contains elements A and C and optionally another element such as B, D, and M. The total content of A+C should preferably be at least 80 at %. The atomic ratio A/C is preferably from $10/100$ to $50/100$.

The B base metal contains element B, preferably elements B and D, and optionally another element such as A, C, and M. The content of B or B+D should preferably be at least 80 at %. Where D is contained, the atomic ratio D/B is preferably from $1/100$ to $10/100$.

The D base metal contains element D and optionally another element such as A, B, C, and M. The content of D should preferably be at least 80 at %.

Conditions in respective sputtering steps are not critical. Where a metal containing a plurality of elements is to be sputtered, an alloy target may be used. Alternatively, a multi-source sputtering technique using a plurality of targets is useful.

In the present disclosure, the thickness of a sputtered film resulting from each metal sputtering step is expressed by a calculated thickness which is a sputtering rate multiplied by a sputtering time. The thickness of a sputtered film of each metal may be determined in accordance with the composition of the metal and the composition of a desired recording layer. Preferably the step of sputtering A—C base metal forms a sputtered film of 20 to 100Å thick; the step of sputtering B base metal forms a sputtered film of 60 to 180Å thick; and the step of sputtering D base metal forms a sputtered film of 5 to 50Å thick.

Next, the composition of the recording layer is described in detail.

In the recording layer, the content of A is preferably up to 28.0 at %, more preferably up to 13.0 at %, further preferably up to 10 at %, most preferably up to 9.0 at %. Too higher A contents would render the recording layer less reliable. That is, recorded marks would tend to crystallize during storage at elevated temperature, resulting in drops of C/N and modulation factor. Repetition of recording would facilitate deterioration of C/N and modulation factor. The content of A in the recording layer is preferably at least 3.0 at %, more preferably at least 4.0 at %. Too low contents of A in the recording layer would obstruct smooth recrystallization of recorded marks and hence, repetitive overwriting.

The unrecorded area preferably contains an $ABC_2$ phase such as $AgSbTe_2$ phase as a crystalline phase. The $ABC_2$ phase is mainly responsible for a change of reflectance of the recording layer. More preferably, the unrecorded area contains a B phase such as Sb phase as well as the $ABC_2$ phase. The B phase is a crystalline phase.

Where D is contained in the recording layer, it is present bound to C, specifically as a D—C phase such as InTe phase in the unrecorded area. The D—C phase is a crystalline phase composed mainly of D and C wherein D:C is regarded substantially 1:1.

The presence of the respective phases is acknowledgeable by a transmission electron microscope, electron probe microanalysis (EPMA), etc.

Preferably the recording layer further contains element M which is at least one element selected from the group consisting of titanium, zirconium, hafnium, vanadium, niobium, tantalum, manganese, tungsten, and molybdenum. It is believed that element M is effective for reducing the crystal transition rate (the rate at which an amorphous or microcrystalline material grows into coarse crystals) by obstructing $ABC_2$ from changing its crystal structure. The reason of addition of element M is described below. When the linear velocity of the recording layer relative to a recording light beam is slow, the thermal influence of a light beam can flood over the irradiated spot. In a phase change type optical recording medium using a recording material of an Ag—Sb—Te system, the region heated by a light beam is quenched to convert into an amorphous or microcrystalline state whereby a signal is recorded. For signal recording areas of long wavelength signals such as 11T signals, a slow linear velocity allows a first irradiated spot to be sequentially slightly heated by the influence of an adjacent subsequently irradiated spot so that the first irradiated spot slowly cools down, resulting in a less amorphous or microcrystalline recorded mark. As a result, C/N and repetitive recording capability are lost. Since element M is effective for reducing the crystal transition rate by restraining crystal growth, it is easy to form amorphous or microcrystalline recorded marks even at a slow relative linear velocity. This ensures a good C/N and a high modulation factor as well as improved repetitive overwrite capability. Among elements M, titanium and vanadium, especially titanium, are more effective for reducing the crystal transition rate. Vanadium and titanium, especially vanadium, are also effective for improving reliability under deleterious conditions such as hot humid conditions. It is then preferred that one or both of titanium and vanadium, especially vanadium, occupies at least 80 at %, especially 100 at % of the entire M.

Specifically, the recording layer has a composition of the formula:

$A_a B_b C_c D_d M_e$ wherein A, B, C, D, and M are as defined above, letters a, b, c, d, and e represent atomic ratios and fall in the range:

$3.0 \leq a \leq 13.0,$
$45.0 \leq b \leq 87.0,$
$8.0 \leq c \leq 34.0,$
$2.0 \leq d \leq 8.0,$
$0 \leq e \leq 5.0,$ more preferably $4.0 \leq a \leq 10.0,$
$54.0 \leq b \leq 82.0,$
$11.0 \leq c \leq 30.0,$
$3.0 \leq d \leq 6.0,$
$0.5 \leq e \leq 5.0,$ most preferably $4.0 \leq a \leq 9.0$, with the proviso that $a+b+c+d+e=100$.

The reason of limitation of a is the same as the aforementioned reason of limitation of the A content.

If b is below the range, the proportion of B phase in the unrecorded portion would be low so that a differential reflectance concomitant with a phase change is increased, but a crystal transition rate is drastically slowed down to impede erasing. If b is beyond the range, a differential reflectance concomitant with a phase change would be reduced to provide a lower modulation factor and crystal transition is accelerated to impede recording at a low linear velocity.

If c is below the range, the amount of C to form the $ABC_2$ phase would be short and the proportion of $ABC_2$ phase declines. In turn, A becomes excessive, forming A phase and undesirable phases other than $ABC_2$ phase. Then element A little diffuses from the recorded mark to the unrecorded portion during recording, or inversely, A diffuses into the recorded marks. Little reliability improvement is achieved or reliability is rather reduced. If c is beyond the range, element C would become excessive even after formation of $ABC_2$ and D—C phases, forming a C phase which lowers a crystal transition rate to impede erasing.

If d is below the range, the proportion of D—C phase would decrease. Since the D—C phase functions to preclude growth of $ABC_2$ phase crystal grains, a lower proportion of D—C phase helps $ABC_2$ phase crystal grains grow. Then recorded marks are insufficiently rendered amorphous, resulting in drops of modulation factor and reliability. If d is beyond the range, excessive D would bond with B to form a D—B phase which reduces the reflectance of an unrecorded portion, resulting in a low modulation factor. The D—B phase has a relatively high crystal transition rate and provides a nucleus upon crystallization so that the crystal transition rate of $ABC_2$ phase is too accelerated.

If e is below the range, a too fast crystal transition rate would result so that recording of long wavelength signals such as 11T signals at a slow linear velocity would result in low C/N and unacceptable repetitive overwrite capability. If e is beyond the range, a differential reflectance concomitant with a phase change would become too small to provide a modulation factor.

Element A is Ag and/or Au, preferably Ag. Preferably Ag occupies at least 50 atom %, more preferably at least 80 atom % of the entire A. Most preferably only Ag is used as element A. If the proportion of Au in the entire element A is too high, a crystal transition rate would be too fast to provide a satisfactory modulation factor and C/N at a low linear velocity of 1.2 to 2.8 m/s.

Element B is Sb and/or Bi, preferably Sb. Preferably Sb occupies at least 50 atom %, more preferably at least 80 atom % of the entire B. Most preferably only Sb is used as element B. If the proportion of Bi in the entire element B is too high, a recording layer would have an increased coefficient of absorption to reduce optical interference, resulting in a reduced reflectance difference between crystalline and amorphous states and hence, a low C/N.

Element C is Te and/or Se, preferably Te. Preferably Te occupies at least 50 atom %, more preferably at least 80 atom % of the entire C. Most preferably only Te is used as element C. If the proportion of Se in the entire element C is too high, a crystal transition rate would be too slow to provide a satisfactory erasing factor.

Element D is In or a mixture of In and Al and/or P. Preferably In occupies at least 60 atom %, more preferably at least 80 atom % of the entire D. If the proportion of In in the entire element D is too low, reliability would be low. Upon recording, in recorded marks, Ag diffuses outward and instead of Ag, In bonds with Te to form an In—Te crystal. Although microcrystalline nuclei of In—Te obstruct crystal growth of $ABC_2$ phase such as $AgSbTe_2$ phase, a smaller amount of In results in a smaller number of microcrystalline nuclei of In—Te, which allows microcrystalline nuclei of $ABC_2$ to bind together to grow. This implies that recorded marks are less stable. The proportion of Al and P is not critical.

In addition to the above-mentioned recording material, the recording layer may contain a minor amount of impurities, for example, Cu, Ni, Zn, Fe, oxygen, nitrogen and carbon. The total amount of these impurities should preferably be up to 0.05 atom %.

The composition of the recording layer is determinable by electron probe microanalysis (EPMA), X-ray microanalysis, etc.

The recording layer generally has a coefficient of absorption k of about 3.3 in a crystalline state and about 2.2 in a microcrystalline or amorphous state.

The recording layer preferably has a thickness of about 100 to 500Å, especially about 130 to 300Å. If the recording layer is too thin, the growth of a crystalline phase would be retarded and a reflectance change concomitant with a phase change would become insufficient. If the recording layer is too thick, much A would diffuse through the recording layer in a direction perpendicular to its surface and less A would diffuse through the recording layer in a direction parallel to its surface (or in-plane direction) upon formation of a recorded mark, resulting in the recording layer losing reliability.

Referring to FIG. 1, there is illustrated one preferred configuration of the optical recording medium according to the present invention. The optical recording medium 1 has a lower dielectric layer 3, a recording layer 4, an upper dielectric layer 5, a reflective layer 6, and a protective layer 7 on a substrate 2.

Since the optical recording medium is adapted to be recorded and read by directing a light beam to the recording layer 4 through the substrate 2, the substrate 2 is preferably formed of a material substantially transparent to such a light beam, for example, resins and glass. For ease of handling and low cost and owing to the eliminated heat treatment for initialization of the recording layer according to the invention, resins are preferred substrate materials. A choice may be made among various resins such as acrylic resins, polycarbonate, epoxy resins and polyolefins. The shape and dimensions of the substrate are not critical although it is generally of disc shape having a diameter of about 50 to 360 mm and a thickness of about 0.5 to 3 mm. The substrate surface may be provided with a predetermined pattern of grooves for tracking and addressing purposes.

The lower dielectric layer 3 plays the role of preventing oxidation of the recording layer 4 and protecting the substrate by shutting off the heat which can otherwise conduct from the recording layer to the substrate upon recording. The upper dielectric layer 5 plays the role of protecting the recording layer and helps the heat remaining in the recording layer after completion of recording release through heat transfer. The lower and upper dielectric layers 3 and 5 are made of any desired dielectric material, for example, silicon oxide such as $SiO_2$, silicon nitride such as $Si_3N_4$, zinc sulfide such as ZnS, mixtures thereof, various transparent ceramics and various species of glass. Also useful are so-called LaSiON materials containing La, Si, O, and N, so-called SiAlON materials containing Si, Al, O, and N, SiAlON containing yttrium, etc. Preferred among these are those materials having a refractive index of at least 1.4, especially at least 1.8 in the wavelength range of 400 to 850 nm. This wavelength range covers 780 nm which is the wavelength used in current CD players and 680 nm which is a candidate wavelength of the next generation recording technology and represents the range over which the optical recording medium of the invention is advantageously operated. Preferred examples of the dielectric material are $Si_3N_4$, a mixture of ZnS and $SiO_2$, a mixture of ZnS and $Si_3N_4$, and a mixture of ZnS and $Ta_2O_5$.

The lower dielectric layer 3 is preferably about 500 to 3,000Å thick, more preferably 1,000 to 2,500Å thick. Within this thickness range, the lower dielectric layer is effective for preventing any damage to the substrate upon recording and higher modulation is available. The upper dielectric layer 5 is preferably about 100 to 300Å, more preferably about 150 to 200Å thick. This thickness range ensures a fast cooling rate and thus permits to define a recorded mark with a clear edge, resulting in reduced jitter. Also higher modulation is available. Each of the upper and lower dielectric layers 3 and 5 may be formed of two or more dielectric laminae of different compositions as will be described later. The dielectric layers are preferably formed by gas phase growth methods such as sputtering and evaporation.

The reflective layer 6 may be formed of any desired material, typically high reflectance metals, for example, Al, Au, Ag, Pt, and Cu alone or alloys containing at least one of these metals. The reflecting layer is about 300 to 3000Å, preferably 300 to 1500Å thick. Reflectance would be short with a thickness below this range. A thickness beyond this range would provide no further improvement in reflectance and add to the cost. The reflecting layer is preferably formed by gas phase growth methods such as sputtering and evaporation.

The protective layer 7 is provided for improving scratch resistance and corrosion resistance. Preferably the protective layer is formed of organic materials, typically radiation curable compounds or compositions thereof which are cured with radiation such as electron and UV radiation. The protective layer is generally about 0.1 to 100 μm thick and may be formed by conventional techniques such as spin coating, gravure coating, spray coating, and dipping.

In another preferred embodiment of the invention wherein the optical recording medium has a sufficiently high reflectance, the lower dielectric layer includes at least one laminate consisting of two dielectric laminae having different refractive index. The dielectric lamina having a higher refractive index in the laminate is disposed adjacent to the substrate.

Figure 2:
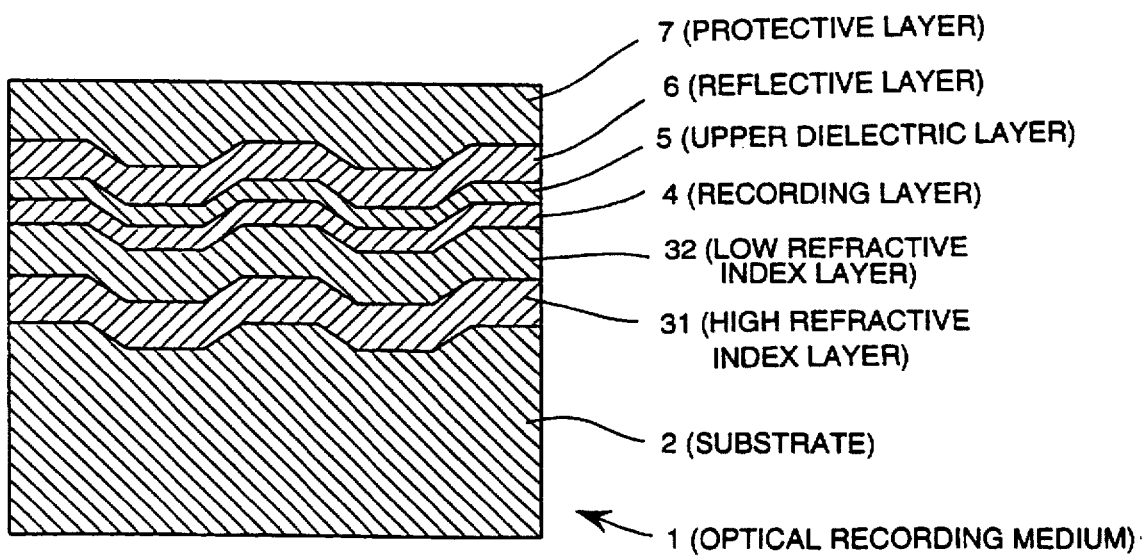
FIG. 2 is a schematic cross-sectional view of a portion of another optical recording medium which is prepared by the present method.

FIG. 2 shows one preferred configuration for this embodiment. The optical recording medium 1 is shown as having a high refractive index dielectric layer 31, a low refractive index dielectric layer 32, a recording layer 4, an upper dielectric layer 5, a reflective layer 6, and a protective layer 7 on a substrate 2. In this configuration, the high refractive index dielectric layer 31 and low refractive index dielectric layer 32 constitute the laminate.

The dielectric material of which the high refractive index layer 31 is made should preferably have a relatively high refractive index, typically at least 2 as measured at a wavelength of 400 to 850 nm. A proper choice may be made among the above-mentioned dielectric materials. The dielectric material of which the low refractive index layer 32 is made should preferably have a relatively low refractive index, typically an refractive index of less than 2 as measured at a wavelength of 400 to 850 nm. Useful dielectric materials having a low refractive index include $SiO_2$, $MgF_2$, $CaF_2$, $LiF_2$ and mixtures thereof. It will be understood that reflectance is further improved by providing more than one such laminate. In practice, however, one or two laminates are preferred because a larger number of laminates reduce modulation.

Preferably, the high refractive index layer 31 is about 500 to 1,500Å thick and the low refractive index layer 32 is about 300 to 1,500Å. Where two laminates are provided, the laminate on the substrate side includes a high refractive index layer of about 750 to 900Å thick, more preferably 800 to 850Å thick and a low refractive index layer of about 400 to 500Å thick, and the other laminate on the recording layer side includes a high refractive index layer of about 750 to 900Å thick, more preferably 800 to 850Å thick and a low refractive index layer of about 1,000 to 1,400Å thick, more preferably 1,200 to 1,300Å thick.

The substrate 2, recording layer 4, upper dielectric layer 5, reflective layer 6 and protective layer 7 are the same as those of FIG. 1.

Described below is how to operate the optical recording medium of the invention for writing and reading.

In the optical recording medium of the invention, the recording layer has crystallized over the entire area immediately after preparation without a need for initializing operation. When a recording light beam, typically laser beam is directed to the recording layer in crystalline state to define a spot, the recording material is melted within the irradiated spot. After removal of the recording light beam, the temperature of the spot drops quickly so that the spot becomes substantially amorphous or microcrystalline to form a signal recorded spot or mark.

When it is desired to rewrite the recorded information, a recording light beam is directed to a spot of the recording layer where a signal is to be newly written while an erasing light beam is continuously directed to the remaining spots. The spots where the erasing light beam is irradiated are heated, but the temperature is relatively low and does not exceed the melting point of the recording material because the erasing light beam is of relatively low power as compared with the recording light beam. However, the erasing light beam is irradiated over a wide area, the resultant heat accumulation provides a gentle temperature gradient so that the cooling rate is slower than the crystal transition rate, allowing for crystallization. The record spot is once melted upon exposure to the recording light beam, but remains in the amorphous or microcrystalline state because the heat is quickly diffused toward the reflective layer. Accordingly, upon rewriting, whether the recording material is crystalline or amorphous (or microcrystalline) before irradiation, those portions irradiated with the recording light beam all become amorphous (or microcrystalline) and those portions irradiated with the erasing light beam all become crystalline. Overwrite recording is done in this way. Such overwrite recording can be carried out by using a single light beam which is modulated into recording and erasing light beams.

Preferably the recording light beam is emitted in pulses. By recording a single signal with two or more pulses of irradiation, the heat accumulation at the record mark is minimized and the swelling of a trailing edge of the record mark known as a teardrop phenomenon is minimized, resulting in improved C/N. The pulse irradiation also provides an increased erasing coefficient.

The power Pw of the recording light beam and the power Pe of the erasing light beam may be empirically determined. The reading light beam should have a low power which does not affect the crystallographic state of the recording layer. Understandably the signal recorded marks in amorphous or microcrystalline state give a lower reflectance than the unrecorded portions in crystalline state.

Preferably the optical recording medium of the invention is operated by rotating it to provide a relative speed of the recording layer relative to the recording light beam of about 1 to 24 m/s, especially 1.2 to 15 m/s. At a higher relative speed, the recording layer is cooled at a too high rate upon recording to allow for sufficient diffusion of element A, resulting in low reliability.

EXAMPLE

Examples of the present invention are given below by way of illustration and not by way of limitation.

Example 1

An optical recording disc as shown in FIG. 1 was prepared by injection molding polycarbonate into a disc shaped substrate 2 having a diameter of 133 mm and a thickness of 1.2 mm. A groove was formed in one major surface of the substrate simultaneous with injection molding. The groove had a width of 0.6 µm, a depth of 400Å, and a pitch of 1.6 µm. On the grooved surface of the substrate, there were formed a lower dielectric layer 3, a recording layer 4, an upper dielectric layer 5, a reflective layer 6, and a protective layer 7.

The lower dielectric layer 3 was formed by sputtering a target of ZnS and $SiO_2$. The value of $SiO_2/(ZnS+SiO_2)$ was 15 mol %. The lower dielectric layer had a refractive index of 2.33 at wavelength 780 nm and a thickness of 1,650Å.

In accordance with Embodiments 1-1 and 2-1, the recording layer 4 was formed as follows.

First as the step of sputtering A—C base metal, a target of $Ag_{25}Te_{75}$ (crystallization temperature 10° C.) was sputtered. The sputtered film had a thickness of 55Å as calculated. Next, as the step of sputtering B base metal, a target of $Sb_{92}In_7V_1$ (crystallization temperature 97° C., In/Sb=0.076) was sputtered. The sputtered film had a thickness of 95Å as calculated. On analysis by ICP, the recording layer was found to have the composition: $Ag_{9.1}Sb_{58.3}Te_{27.5}In_{4.4}V_{0.7}$ (atomic ratio). The recording layer had a thickness of 150Å as calculated. It is to be noted that the composition of all the alloys is expressed in atomic ratio.

The upper dielectric layer 5 was formed by the same procedure as the lower dielectric layer 3. The upper dielectric layer had a thickness of 150Å. The reflecting layer 6 was formed by sputtering a target of Al—Ni to a thickness of 1,000Å. The protective layer 7 was formed by applying a UV curable resin by spin coating and exposing it to UV for curing. The protective layer as cured had a thickness of 5 µm.

The thus prepared phase change type optical recording disc was designated sample No. 1.

Next, a disc sample No. 2 was prepared by the same procedure as sample No. 1 except that a recording layer was formed to a thickness of 150Å (as calculated) using a target in the form of a Sb target having chips of Ag, In, Te, and V attached thereto. It is a comparative sample by simultaneous sputtering.

Sample No. 1 showed a reflectance of 32% at wavelength 780 nm and a high reflectance of at least 30% in the wavelength range of 600 to 850 nm. In contrast, sample No. 2 showed a reflectance of only 6% at wavelength 780 nm. After the recording layer of sample No. 2 was initialized by means of a bulk eraser, it showed a reflectance of 32% at wavelength 780 nm and its reflectance profile with varying wavelength was substantially the same as sample No. 1. This suggests that the recording layer of sample No. 1 prepared in accordance with the present method is in substantially the same crystallized state as the conventional once initialized recording layer.

Next, a disc sample No. 3 was prepared by the same procedure as sample No. 2 except that a glass substrate was used. After this sample was heated at 200° C. for 10 minutes, it was found that the recording layer was in the same crystallized state as accomplished by initialization by a bulk eraser. When sample No. 2 using a polycarbonate substrate was heated at 200° C. for 10 minutes, the substrate deformed, prohibiting tracking.

The recording layers of the above-prepared samples were examined by transmission electron microscopy, EPMA, and X-ray microanalysis to find a crystalline mixture of $AgSbTe_2$, Sb, and InTe phases.

A disc sample No. 4 was prepared by the same procedure as sample No. 1 except that in the forming of a recording layer, the Ag—Te film was 150Å thick and the Sb—In—V film was 50Å thick. Although amorphous regions were left in the recording layer as discrete spots, this sample showed a reflectance of 28% at wavelength 780 nm. When the Ag—Te film was 15Å thick, the recording layer was more under-crystallized.

A disc sample No. 5 was prepared by the same procedure as sample No. 1 except that the Sb—In—V film was followed by the Ag—Te film in the forming of a recording layer. Although amorphous regions were left in the recording layer as discrete spots, this sample showed a reflectance of 28% at wavelength 780 nm.

A disc sample No. 6 was prepared by the same procedure as sample No. 1 except that the recording layer was formed in accordance with Embodiment 1-2. This sample showed a reflectance and reflectance profile equivalent to those of the sample prepared in accordance with Embodiment 1-1.

For all the samples, similar results were obtained when Sb in the recording layer was partially replaced by Bi. When more than 80 at % of Sb was replaced by Bi, however, the recording layer had a higher coefficient of absorption so that the optically available reflectance difference between crystalline and amorphous states was reduced, resulting in a reduced modulation factor.

For all the samples, similar results were obtained when V in the recording layer was at least partially replaced by Ti. The benefits of the invention were also observed when V in the recording layer was at least partially replaced by Zr, Hf, Nb, Ta, Mn, W, Mo or a mixture thereof. In an example where Ag was partially replaced by Au, the crystallization rate was somewhat higher than with Ag alone, but equivalent results to Ag alone were obtained by increasing the amount of V added.

For all the samples, when V was omitted from the recording layer, some drops of C/N and modulation factor were observed and properties after storage were also a little deteriorated.

Example 2

A disc sample was prepared by substantially the same procedure as sample No. 1 in Example 1. The recording layer was formed in accordance with Embodiments 1-2 and 2-2, that is, in the order of (A—C)→B→D.

| Metal | Type | Film thickness | Tx |
| --- | --- | --- | --- |
| $Ag_{20}Te_{80}$ | (A–C) | 58 Å | 11° C. |
| $Sb_{100}$ | B | 92 Å | 90° C. |
| $In_{80}V_{20}$ | D | 10 Å | 280° C. |

The steps of sputtering A—C base metal, B base metal, and D base metal were successively carried out. ICP analysis showed that the recording layer had the composition: $Ag_{6.3}Te_{27.0}Sb_{59.7}In_{5.2}V_{1.8}$ (atomic ratio). The recording layer had a total thickness of 160Å.

Some layers were modified as follows.

| Lower dielectric layer | ZnS—$SiO_2$ | 1500 Å |
| --- | --- | --- |
| Upper dielectric layer | ZnS—$SiO_2$ | 150 Å |
| Reflecting layer | Au | 1000 Å |

This sample showed a reflectance of more than 30% in the wavelength range of 650 to 850 nm.

The benefits of the invention are evident from the results of these samples.

Japanese Patent Application No. 47822/1995 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A method for preparing an optical recording medium comprising the step of forming a phase change recording layer on a substrate, said recording layer comprising a recording material containing elements A, B and C, wherein A is at least one element of silver and gold, B is at least one element of antimony and bismuth, and C is at least one element of tellurium and selenium, said recording layer having a thickness of 100 to 500Å, said recording layer forming step including successively manner the step of sputtering from an A—C base metal target composed mainly of elements A and C and the step of sputtering from a B base metal target composed mainly of element B, and the method being free of a separate step for crystallizing the recording layer for initialization.

2. The method of claim 1 wherein said B base metal target contains element D wherein D is indium or a mixture of indium and at least one of aluminum and phosphorus.

3. The method of claim 2 wherein at least one of said A—C base metal target and said B base metal target further contains M wherein M is at least one element selected from the group consisting of Ti, Zr, Hf, V, Nb, Ta, Mn, W, and Mo.

4. The method of claim 1 wherein said recording layer forming step includes subsequently the step of sputtering a D base metal target composed mainly of element D, wherein D is indium or a mixture of indium and at least one element of aluminum and phosphorous.

5. The method of claim 4 wherein at least one of said A—C base metal target, said B base metal target, and said D base metal target further contains M wherein M is at least one element selected from the group consisting of Ti, Zr, Hf, V, Nb, Ta, Mn, W, and Mo.

6. The method of claim 1 wherein said recording material is of the formula:

$$A_aB_bC_cD_dM_e$$

wherein A is at least one element of silver and gold, B is at least one element of antimony and bismuth, C is at least one element of tellurium and selenium, D is indium or a mixture of indium and at least one of aluminum and phosphorus, M is at least one element selected from the group consisting of Ti, Zr, Hf, V, Nb, Ta, Mn, W, and Mo, letters a, b, c, d, and e represent atomic ratios and fall in the range:

$$3.0 \leq a \leq 13.0,$$
$$45.0 \leq b \leq 87.0,$$
$$8.0 \leq c \leq 34.0,$$
$$2.0 \leq d \leq 8.0,$$
$$0 \leq e \leq 5.0,$$
$$a + b + c + d + e = 100.$$

7. The method of claim 6 wherein the recording layer contains an $ABC_2$ phase.

8. The method of claim 6 wherein the recording layer contains a B phase.

9. The method of claim 6 wherein the recording layer contains a D—C phase.

10. A method for preparing an optical recording medium comprising the step of forming a phase change recording layer on a substrate, said recording layer comprising a recording material containing element B and a low Tx metal wherein B is at least one element of antimony and bismuth, said recording layer having a thickness of 100 to 500Å, said recording layer forming step including successively the step of sputtering from a B base metal target composed mainly of element B and the step of sputtering from a low Tx metal target composed mainly of a metal element having a lower crystallization temperature than said element B, and the method being free of a step for crystallizating the recording layer for initialization.

11. The method of claim 10 wherein said recording layer forming step further includes subsequent a successive step to said B base metal target sputtering step, the step of sputtering a high Tx metal target composed mainly of a metal element having a higher crystallization temperature than said element B.

12. The method of claim 10 wherein said recording material is of the formula:

$$A_a B_b C_c D_d M_e$$

wherein A is at least one element of silver and gold, B is at least one element of antimony and bismuth, C is at least one element of tellurium and selenium, D is indium or a mixture of indium and at least one of aluminum and phosphorus, M is at least one element selected from the group consisting of Ti, Zr, Hf, V, Nb, Ta, Mn, W, and Mo, letters a, b, c, d, and e represent atomic ratios and fall in the range:

$$3.0 \leq a \leq 13.0,$$
$$45.0 \leq b \leq 87.0,$$
$$8.0 \leq c \leq 34.0,$$
$$2.0 \leq d \leq 8.0,$$
$$0 \leq e \leq 5.0,$$
$$a + b + c + d + e = 100.$$

13. The method of claim 12 wherein the recording layer contains an $ABC_2$ phase.

14. The method of claim 12 wherein the recording layer contains a B phase.

15. The method of claim 12 wherein the recording layer contains a D—C phase.

* * * * *

UNITED STATES PATENT AND TRADEMARK OFFICE
CERTIFICATE OF CORRECTION

PATENT NO. : 5,627,012
DATED : 6 May 97
INVENTOR(S) : Junjii TOMINAGA ET AL.

It is certified that error appears in the above-identified patent and that said Letters Patent is hereby corrected as shown below:

Column 15, line 67, delete "manner"

Column 16, line 51, after "metal" insert --,--

Signed and Sealed this

Twenty-ninth Day of July, 1997

Attest:

BRUCE LEHMAN

*Attesting Officer*   *Commissioner of Patents and Trademarks*